(12) United States Patent
Pan et al.

(10) Patent No.: US 8,963,558 B2
(45) Date of Patent: Feb. 24, 2015

(54) CURRENT DIFFERENTIAL PROTECTION

(71) Applicant: General Electric Company, Schenectady, NY (US)

(72) Inventors: Yan Pan, Niskayuna, NY (US); William James Premerlani, Scotia, NY (US)

(73) Assignee: General Electric Company, Niskayuna, NY (US)

( * ) Notice: Subject to any disclaimer, the term of this patent is extended or adjusted under 35 U.S.C. 154(b) by 328 days.

(21) Appl. No.: 13/665,479

(22) Filed: Oct. 31, 2012

(65) Prior Publication Data

US 2014/0118000 A1     May 1, 2014

(51) Int. Cl.
*G01R 31/08* (2006.01)
*H02H 3/30* (2006.01)
*H02H 7/26* (2006.01)
*H02H 1/00* (2006.01)

(52) U.S. Cl.
CPC .............. *G01R 31/08* (2013.01); *H02H 3/305* (2013.01); *H02H 7/263* (2013.01); *H02H 1/0061* (2013.01)
USPC ............. 324/537; 324/522; 324/532; 361/44; 361/65

(58) Field of Classification Search
USPC ......... 324/537, 509, 522, 532; 361/44, 45, 65
See application file for complete search history.

(56) References Cited

U.S. PATENT DOCUMENTS

| | | |
|---|---|---|
| 3,786,419 A | 1/1974 | Nick |
| 4,470,093 A | 9/1984 | Yamaura |
| 4,760,487 A | 7/1988 | Kwong et al. |
| 5,809,045 A | 9/1998 | Adamiak et al. |
| 5,958,060 A | 9/1999 | Premerlani |
| 6,148,267 A | 11/2000 | Premerlani |
| 6,311,307 B1 | 10/2001 | Adamiak et al. |
| 6,456,947 B1 | 9/2002 | Adamiak et al. |
| 6,571,182 B2 | 5/2003 | Adamiak et al. |
| 6,678,134 B2 | 1/2004 | Sugiura et al. |

(Continued)

FOREIGN PATENT DOCUMENTS

| | | |
|---|---|---|
| EP | 1780858 | 5/2007 |
| WO | 9811641 | 3/1998 |

OTHER PUBLICATIONS

EP Search Report and Written Opinion dated Apr. 2, 2014 issued in connection with corresponding EP Patent Application No. 13190440.1.

(Continued)

*Primary Examiner* — Vincent Q Nguyen
(74) *Attorney, Agent, or Firm* — Nitin N. Joshi

(57) ABSTRACT

A current differential protection system for a multi-terminal power line includes a current sensor for sensing a current at a local terminal, a controller for time synchronizing the local terminal and remote terminals, and a fault detection module to detect a fault in the multi-terminal power line if a differential current exceeds a threshold value. The controller includes a time measurement exchange module for exchanging time stamp data with remote terminals, an upper range clock for exchanging time stamp data with remote terminals and a lower range clock for indexing the current at the local terminal. A first time period of the upper range clock is N times a second time period of the lower range clock where N is a number of multi-terminals. The controller includes a clock offset calculation module for determining an average time offset based on time stamp data from remote terminals and the local terminal.

20 Claims, 6 Drawing Sheets

(56) References Cited

U.S. PATENT DOCUMENTS

| | | |
|---|---|---|
| 6,915,219 B2 | 7/2005 | Premerlani |
| 7,126,800 B2 | 10/2006 | Premerlani et al. |
| 7,444,248 B2 | 10/2008 | Premerlani et al. |
| 7,472,026 B2 | 12/2008 | Premerlani et al. |
| 7,567,881 B2 | 7/2009 | Kasztenny et al. |
| 8,154,836 B2 | 4/2012 | Kasztenny et al. |
| 2002/0060497 A1 | 5/2002 | Arita et al. |
| 2011/0063766 A1 | 3/2011 | Kasztenny et al. |

OTHER PUBLICATIONS

H. Miller et al., "Modern Line Current Differential Protection Solutions," Protective Relay Engineers 63rd Conference, Mar. 29, 2010-Apr. 1, 2010, pp. 1-25.

M. G. Adamiak et al., "A New approach to current Differential Protection for Transmission Lines," Electrical Council of New England, Oct. 22-23, 1998, pp. 1-16.

though two terminals are shown in FIGS. 3 and 4, the concept is equally applicable to multi-terminal systems.

CURRENT DIFFERENTIAL PROTECTION

BACKGROUND

Embodiments of the system relate generally to an electric power system and more specifically to protection systems for the electric power system.

Many power system monitoring, protection, and control functions could be performed more efficiently and accurately if power system digital measurements at multiple locations were synchronized. Generally such measurements are only somewhat synchronized because of difficulty in accurately synchronizing sampling clocks physically separated by large distances. Conventional uses of digital communications to synchronize sampling clocks at remote locations have accuracies limited by uncertainties in the message delivery time. In particular, digital communications can have different delays in different directions between a pair of locations which lead to an error in clock synchronization.

In addition to being important for multi-terminal transmission lines, clock synchronization is important in many other applications such as power relays, determinations of sequences of events, economic power dispatch, and any other situation requiring synchronization of clocks. Utilizing geographical positioning system (GPS) is one solution, however, it needs additional hardware and increases cost. Communication between various terminals at various locations is another solution; however, the main challenge in communication is caused by a clock rollover. Generally the clocks utilized are with a limited number of bits to save communication bandwidth which puts a limit on maximum time the clock can measure. Since the clocks have limits on maximum time, it results in independent clock rollovers which make multi-terminal clocks converge to a stable but non-synchronized status in which clocks are evenly dispersed along the whole clock range.

For these and other reasons, there is a need for an improved differential protection system.

BRIEF DESCRIPTION

In accordance with an embodiment of the present invention, a current differential protection system for a multi-terminal power lines is presented. The current differential protection system includes a current sensor for sensing a current at a local terminal, a controller for time synchronizing the local terminal and remote terminals and a fault detection module to detect a fault in the multi-terminal power line if a differential current exceeds a threshold value. The controller includes a time measurement exchange module for exchanging time stamp data with remote terminals. The controller also includes an upper range clock for providing local time measurements to the time measurement exchange module and a lower range clock for indexing the current at the local terminal. A first time period of the upper range clock is N times a second time period of the lower range clock where N is a number of terminals in the multi-terminal system. The controller further includes clock offset calculation module for determining an average time offset based on time stamp data from remote terminals and the local terminal and a phase-frequency locked loop for determining phase and frequency signals for the upper range clock and the lower range clock based on the average time offset.

In accordance with another embodiment of the present invention, a method of protecting a multi-terminal power line is presented. The method includes sensing a current at a local terminal and exchanging time stamp data with remote terminals. The method further includes utilizing an upper range clock for providing local time measurements and utilizing a lower range clock for indexing the current at the local terminal, wherein a first time period of the upper range clock is N times a second time period of the lower range clock where N is a number of terminals in the multi-terminal system. The method also includes determining an average time offset based on time stamp data from remote terminals and the local terminal, determining phase and frequency signals for the upper range clock and the lower range clock based on the average time offset and detecting a fault in the multi-terminal power line if a differential current exceeds a threshold value.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The embodiments described herein are directed to a power system protection system that enables synchronization of clocks at multiple terminals of a transmission system. While embodiments of the clock synchronization will be described in the context of the transmission system, it will be appreciated by those skilled in the art that the system can be used for other applications such as a power distribution system, power relays, determinations of sequences of events, economic power dispatch, and any other situation requiring synchronization of clocks.

As used herein, the terms "module" or "controller" refers to software, hardware, or firmware, or any combination of these, or any system, process, or functionality that performs or facilitates the processes described herein.

Figure 1:
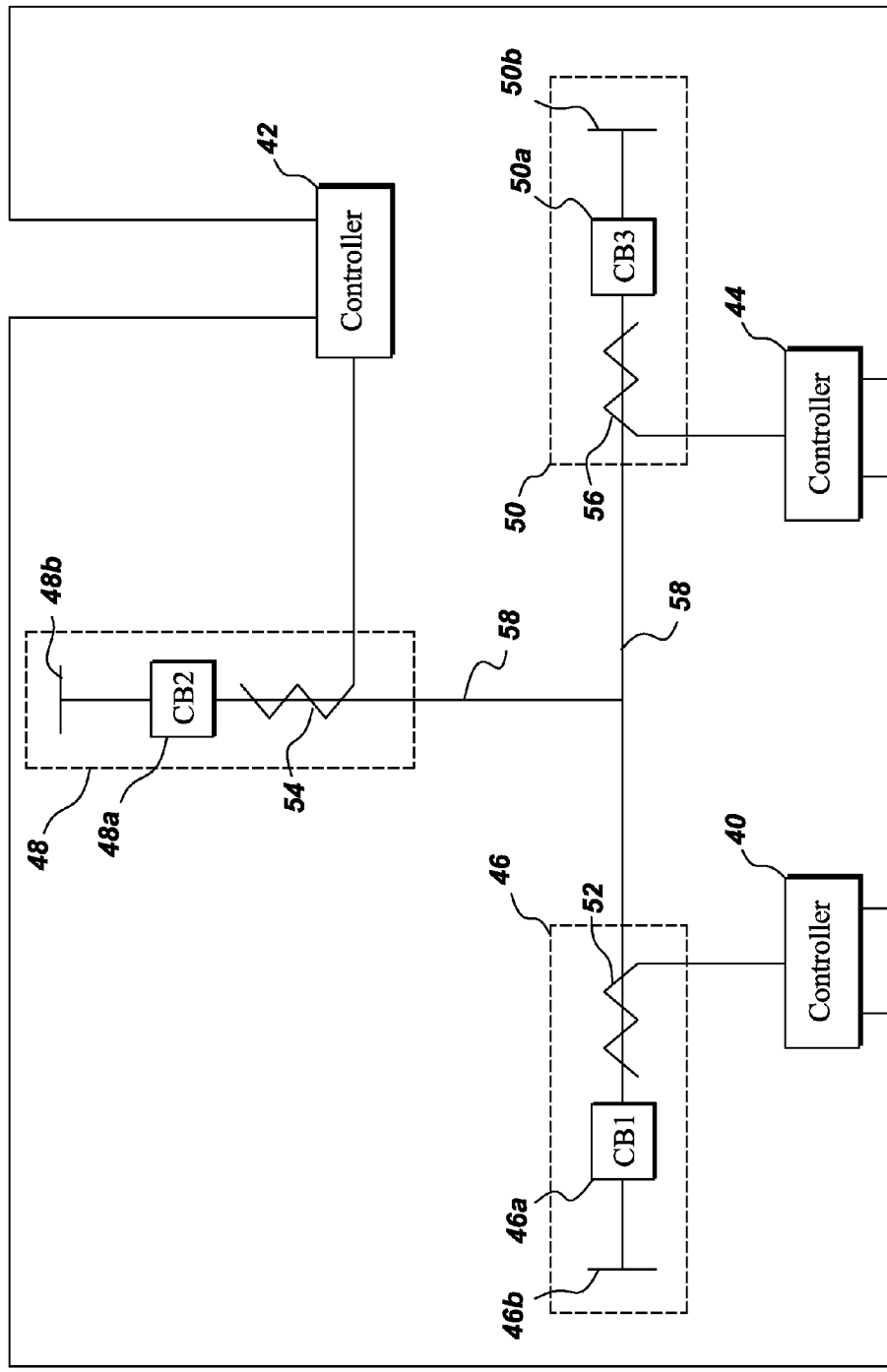
FIG. 1 is a block diagram of a multi-terminal transmission system.

FIG. 1 is a block diagram of a multi-terminal transmission system 30 including three terminals 46, 48 and 50 with a power line 58 and communication lines 60a, 60b, and 60c therebetween. In one embodiment, two communication lines may be utilized between two terminals for communication redundancy purposes. Current sensors 52, 54, and 56 provide current signals to respective local relays or controllers 40, 42 and 44. In one embodiment, controllers 40, 42 and 44 receive current measurements from the remote terminals as well as the associated local terminal, and identify fault conditions on power line 58. In general, current differential relaying is a basic application of Kirchhoff's Current Law. Thus, controllers 40, 42 and 44 apply a fault detection logic based on a difference between a local current and a remote current.

One simple example of the fault detection logic is given here. In this example, if a differential current $I_{diff}$, which is a difference of a local phase current I1 and remote phase currents I2 and I3, exceeds a threshold $I_t$ then the fault is detected. It should be noted here that the remote terminals measure remote currents I2 and I3 in reverse direction and hence its polarity is reversed. Thus, the differential current $I_{diff}$ is given as a vector sum of the three currents:

$$I_{diff}=|\overline{I1}+\overline{I2}+\overline{I3}| \quad (1)$$

However, if remote terminals also measure current in the same direction as the local terminal then the differential current would be vector subtraction of three currents. The threshold is a sum of minimum differential current $I_{min}$ that can flow through the transmission line and a restraint current $I_r$ that is a bias value permissible beyond the minimum current $I_{min}$.

$$I_t=I_{min}+I_r \quad (2)$$

The restraint current Ir may be given as:

$$I_r=k[|I1|+|I2|+|I3|] \quad (3)$$

where k may be a constant value or a variable depending on the value of the differential current. Other methods of determining the restraint current Ir may be given as: Ir=k*maximum (I1, I2, I3 . . . ), and Ir=sqrt(I1*I1+I2*I2+I3*I3).

In addition to a respective current sensor, each terminal 46, 48 and 50 also includes, among other components, a respective circuit breaker 46a, 48a and 50a and a respective bus 46b, 48b and 50b. Circuit breakers 46a, 48a and 50a break a connection between respective bus 46b, 48b and 50b and power line 58 in case of fault. In one embodiment, wherein the transmission lines have three phases, each of current sensors 52, 54, and 56 includes three sensors with each sensor sensing a respective phase current of the transmission line.

In one embodiment, each of controllers 40, 42 and 44 may include a processor, such as but not limited to at least one microprocessor, a microcontroller, a graphics processor, a digital signal processor (DSP), or any other type of processor or processing circuit. The processor may further include a memory such as random access memory (RAM), flash memory, one or more hard drives, and/or one or more drives that handle removable media and a display.

Figure 2:
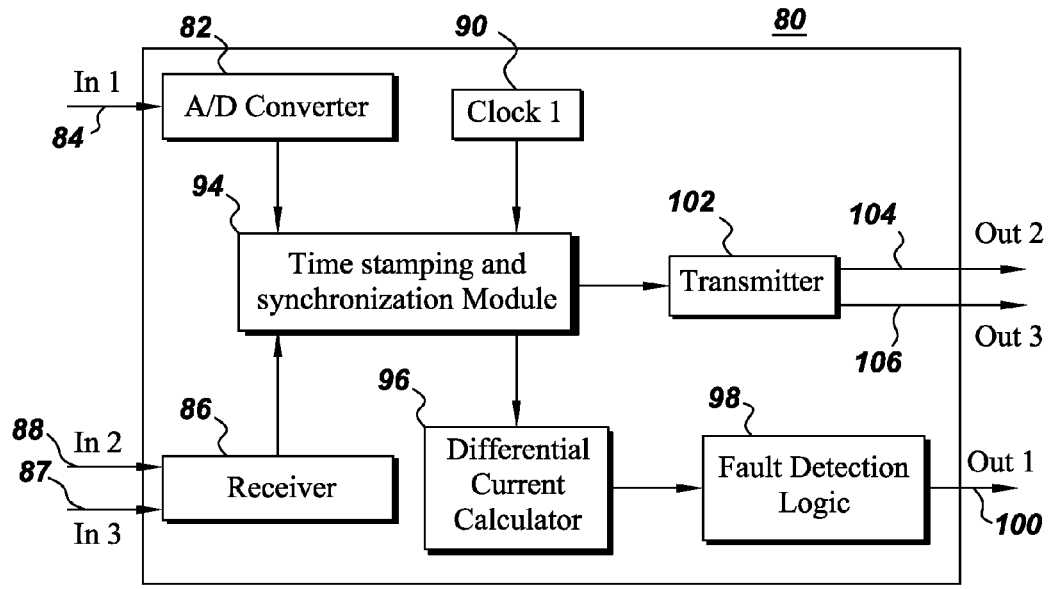
FIG. 2 is a block diagram of a controller utilized at each terminal of a multi-terminal transmission system in accordance with an embodiment of the present invention.

FIG. 2 is a block diagram of a controller 80 utilized at each terminal of a multi-terminal transmission system in accordance with an embodiment of the present invention. Controller 80 includes an analog to digital (A/D) converter 82 which receives a current signal 84 from a respective current sensor (not shown) and a receiver 86 which receives a time signal 87 and an indexed current signal 88 from a remote terminal. At each terminal, the three phase currents i.e., phasors are sampled a number (K) of times per cycle. Controller 80 further includes a clock 90 and a time stamping and synchronization module 94. The clock 90 is not any general clock but is based on a counter and which is limited on the maximum time to save communication bandwidth. In one embodiment, clock 90 is a dual range clock as explained in subsequent paragraphs.

In one embodiment, time stamping and synchronization module 94 has three functions. The three functions are i) clock synchronization between two different terminals, ii) phasor tagging and indexing local current measurements and iii) aligning indexed current measurements at the local terminal and the remote terminals. The clock synchronization is achieved with a phase-frequency locked loop (PFLL). Indexing and alignment is achieved by tagging the local phasors with sequence numbers. For example, if the maximum sequence number is K then in each time cycle the phasors are sampled K times and are tagged with an appropriate index number. Thus, if the two clocks at two different terminals are not synchronized and there is a time difference or if there is a time delay in transmitting a signal from one terminal to another terminal then there will be an index mismatch.

A differential current calculator 96 utilizes aligned current measurements from the local and the remote terminal and determines the differential current value. Furthermore, a fault detection logic 98 compares the differential current value with the threshold value and sends an output signal 100 to a circuit breaker and may also display the fault indication. A transmitter 102 transmits indexed current measurements 104 and local time signal 106 to other terminals. It should be noted that components of controller 80 shown here are only for exemplary purpose and some of the components may be modified, added or removed as per the requirement. For example, in one embodiment receiver 86 may receive signals from more than one terminal and accordingly the components will be modified.

Figure 3:
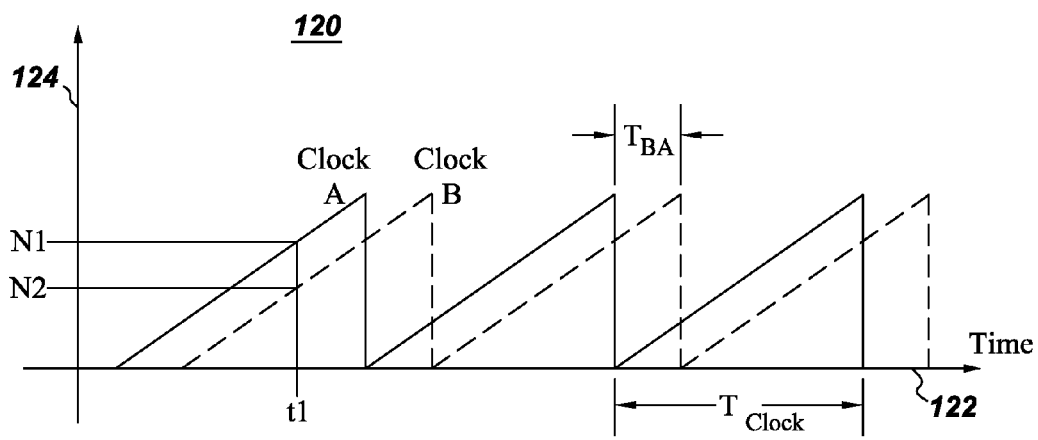
FIG. 3 is a graphical representation of a time shift error between two terminal clocks.

FIG. 3 shows a graphical plot 120 representing a time shift error between two terminal clocks. In plot 120, horizontal axis 122 represents real time and vertical axis 124 represents a clock time. There are two clocks, clock A and clock B one at terminal A and one at terminal B respectively. The clocks roll over with a period of $T_{clock}$ (i.e., after time period $T_{clock}$, the counter of the clock resets). In the embodiment shown, clock B lags behind or is time shifted by time $T_{BA}$ relative to clock A. This is because the frequency of clock B is synchronized with that of clock A and due to the communication delay, clock B rolls over after clock A has rolled over. However, in another embodiment, clock A may be considered to lag relative to clock B as both clocks are synchronized to each other. It should be noted here that in one embodiment, synchronization means the delays in communication are fed as input to PFLL at each controller and accordingly the respective clock times are adjusted. Thus, the value of $T_{BA}$ is positive if clock B rolls over after clock A, and negative if clock B rolls over before clock A. Furthermore, with this logic, the value of $T_{BA}$ is always greater than $-T_{clock}/2$, and less than $T_{clock}/2$. As can be seen from the plot 120, at time t1, clock A counter reads N1 whereas clock B counter reads N2. Thus, current signals $I_A$ and $I_B$ at terminals A and B will get indexed accordingly (i.e., at time t1, $I_A$ will be indexed $I_A(N1)$ whereas $I_B$ will be indexed $I_B(N2)$. This results in error when the same indexed current signals from two terminals ($I_A(N1)$ and $I_B(N1)$) are compared together as they are not from the same time instant t1 and may result in false fault detection or false trip of the circuit breaker. Thus, the time synchronization of two clocks is important.

Figure 4:
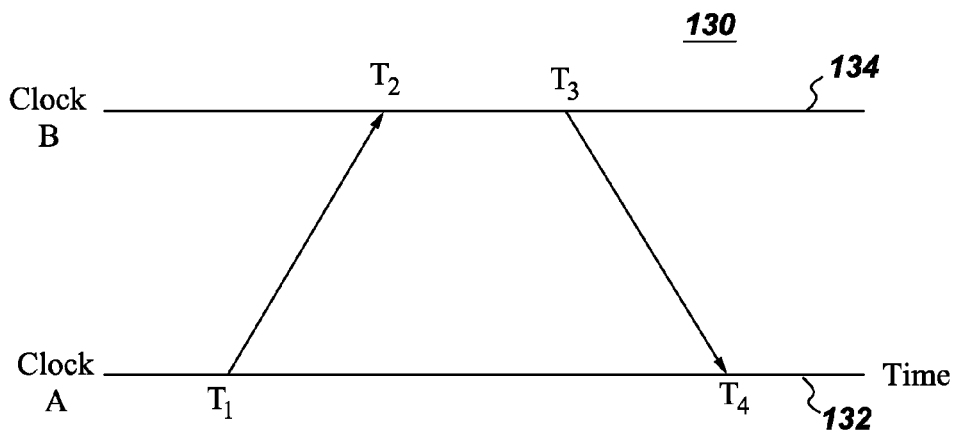
FIG. 4 is a graphical representation of a communication delay between two terminals with clock rollover scenarios.

FIG. 4 shows a graphical plot 130 representing a communication delay between two terminals with clock rollover scenarios. In plot 130, two clock times 132 and 134 related to two clocks of terminals A and B respectively are shown. For each round trip message exchange between terminal A and terminal B, 4 local time measurements are made. For example, for a round trip message exchange between terminal A and terminal B, the following four measurements are made:

i) T1—time measured by clock A when a message is sent from terminal A to B.
ii) T2—time measured by clock B when the message from terminal A is received.

iii) T3—time measured by clock B when a return message is sent from terminal B to A.

iv) T4—time measured by clock A when the return message is received.

Provided that the communications delay from terminal A to B is the same as the delay from terminal B to A, the phase error of A relative to B (i.e., communication time delay between terminal B and A) can be computed from:

$$T_{AB} = \frac{T1 + T4 - T2 - T3}{2} \quad (4)$$

The above equation will be easier to understand if the times T1, T2, T3 and T4 are considered as counter values. However, because of the rollover status of the clocks, there may be several different answers, depending on the timing of the rollover events with respect to the timing of the current measurements which depends on several variables, including the relative offset between the clocks, the communication delay, and the processing delay. It should be noted that there is a time difference between actual current measurement and when the message is actually sent to a remote terminal. For example, on a 1-10 count basis, if T1 is equal to count 8, then the actual current measurement may have happened at count 7.

There are two instances of rollover that can affect the differential current calculation: i) rollover before the first measurement of a pair of measurements (i.e., before T1 or T2); and ii) rollover between the pair of measurements (i.e., either between T1 and T4 or between T2 and T3).

Figure 5A:
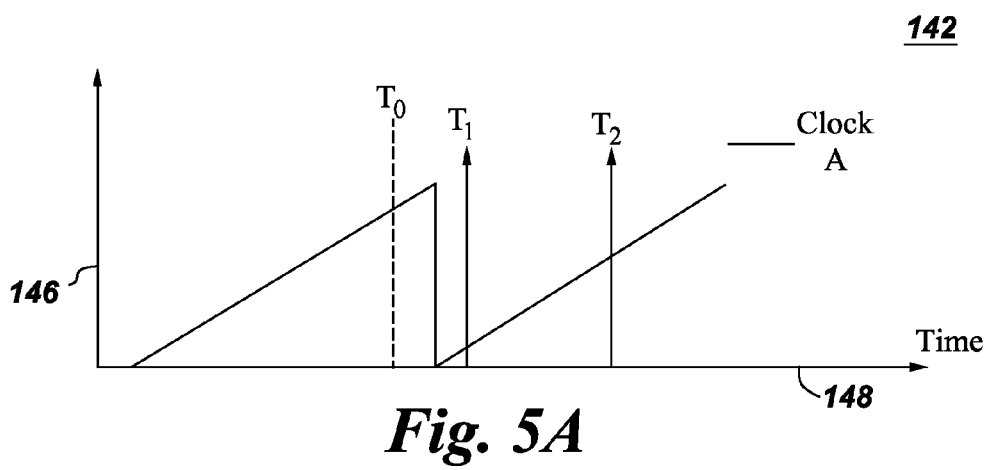
FIGS. 5A and 5B are graphical representations of clock rollover at a terminal with respective message sent and/or message received times.
Figure 5B:
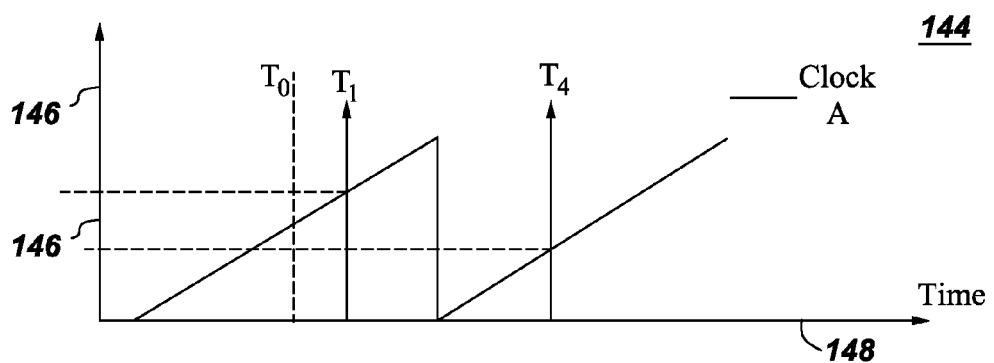

For explanation purposes, the first case is illustrated in FIG. 5a and the second case is illustrated in FIG. 5b. FIG. 5a shows a plot 142 of clock rollover at terminal before an actual current measurement time T0. Plot 142 also shows a time t2 which is when the message is received at terminal 2. As can be seen from plot 142 that a rollover instance occurs between T0 and T1. FIG. 5b shows a plot 144 of clock rollover at terminal A with actual current measurement time T0, and message sent and received times T1 and T4 respectively. In both plots 142 and 144, a horizontal axis 148 represents real time in second and a vertical axis 144 represents a clock time in count number. It can be seen from plot 144 that the rollover instance occurs between T1 and T4 where value of T1 is greater than value of T4. This happens because the counter of clock A is near maximum count at time T1 and then a new count starts for T4. Thus, the algorithm for detecting and compensating for the rollover of clock A between T1 and T4 is:

$$\text{If } (T1>T4) \text{ then } (T4=T4+T_{clock}) \quad (5)$$

Similarly, the algorithm for detecting and compensating for rollover of clock B between T2 and T3 is:

$$\text{If } (T2>T3) \text{ then } (T3=T3+T_{clock}) \quad (6)$$

For the first case, the rollover of the clock A prior to T1 causes an error of $-T_{clock}$ in both T1 and T4 and a rollover of clock B prior to T2 will cause an error of $T_{clock}$ in both T2 and T3, so that will generate an error of $-T_{clock}$ in $T_{AB}$. Since the valid range of $T_{AB}$ is $-T_{clock}/2$ to $T_{clock}/2$, an error of + or $-T_{clock}$ will drive the result outside of that range. Thus, the following corrections are utilized:

$$\text{If } (T_{AB}>T_{clock}/2) \text{ then } (T_{AB}=T_{AB}-T_{clock}) \quad (7)$$

$$\text{If } (T_{AB}<-T_{clock}/2) \text{ then } (T_{AB}=T_{AB}+T_{clock}) \quad (8)$$

Figure 6:
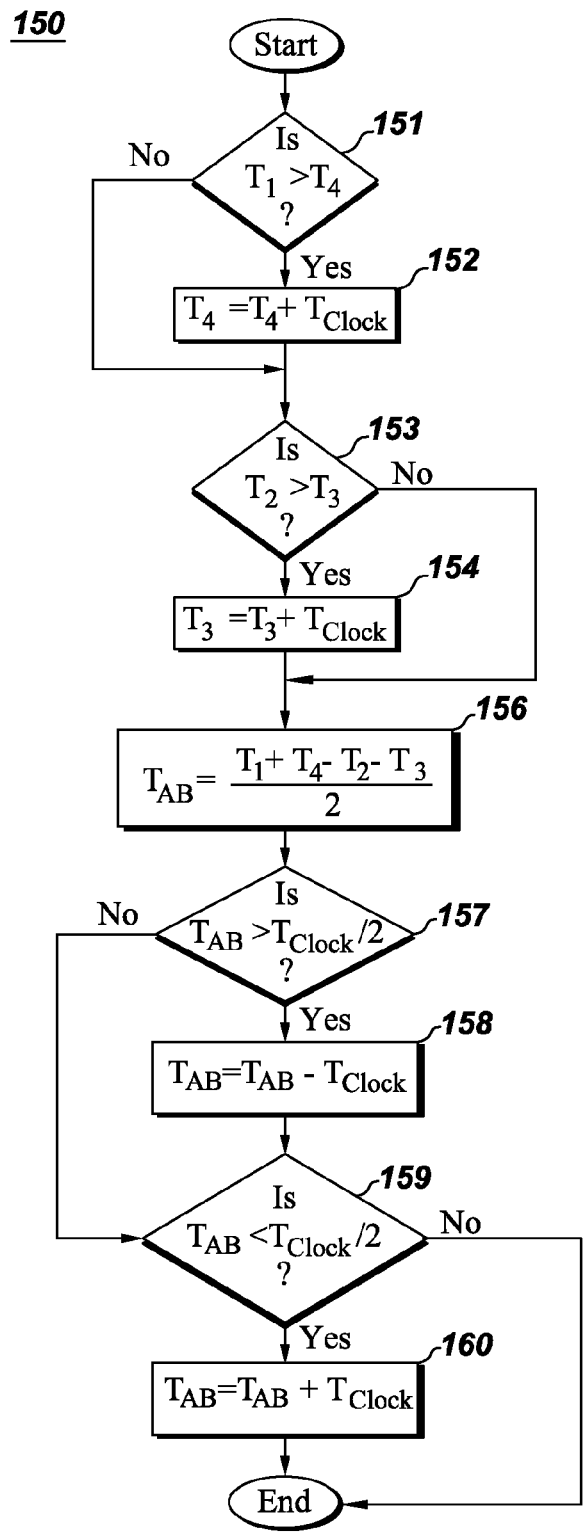
FIG. 6 is a flow chart representing steps involved in a method of determining time delay in communication between two terminals in accordance with an embodiment of the present invention.

FIG. 6 shows a flowchart 150 describing a method of determining time delay in communication between two terminals as discussed above. The method includes determining whether a rollover occurs between T1 and T4 by comparing T1 and T4 in step 151. If the rollover occurs the method moves to step 152 else the method moves to step 153. At step 152, if the rollover occurs between T1 and T4 or if T1 is greater than T4 then the time T4 is modified to T4+Tclock. At step 153, it is determined whether a rollover occurs between T2 and T3 and if the answer is yes then the method moves to step 154 else to step 156. At step 154, if the rollover occurs between T2 and T3 or if T2 is greater than T3 then the time T3 is modified to T3+Tclock. The method further includes determining a first time delay in step 156 by utilizing an equation $T_{AB}$=(T1+T4−T2−T3)/2. At step 157, it is determined whether a clock rollover occurs before T1 by determining whether $T_{AB}$ is greater than $T_{clock}/2$ and if the clock rollover occurs then the method moves to step 158 else to step 159. At step 158, the first delay is modified to $T_{AB}=T_{AB}-T_{clock}$. At step 159, again it is determined whether the clock rollover occurs before T2 or not by determining whether $T_{AB}$ is less than $(-T_{clock}/2)$, if yes then the method moves to step 160 else the method ends. Finally at step 160 if the clock rollover occurs before T2 then the time delay $T_{AB}$ is further modified to $T_{AB}=T_{AB}+T_{clock}$. The resulting time shift estimate or modified time delay is then used as the phase input to the PFLL to synchronize clocks at two terminals and to compensate for communication delay.

The algorithm discussed in FIG. 6 works for two terminal systems. In a multi-terminal system with more than 2 terminals a ring communication system may be utilized. In this case, clocks synchronize with one another in a ring fashion which results in propagation of time delay from first clock to the last clock. As an example, in a three terminal system, terminal A sends and receives messages to/from terminal B; terminal B sends and receives messages to/from terminal C which again sends and receives messages to/from terminal A. In such a case because the time delay propagates from one clock to another clock, overall delay from the first clock to the last clock will be high. Furthermore, it may happen that when the time period $T_{clock}$ of the clocks is small because of the high time delay, the clocks will never synchronize with each other. This may result in erroneous tagging of the phasors and generate false trippings of circuit breakers.

In accordance with an embodiment of the present invention a dual range clock is utilized to synchronize the clocks. The dual range clock includes an upper range clock and a lower range clock. The lower range clock is utilized for phasor tagging and the upper range clock is utilized for time or clock synchronization as explained in FIG. 6. Furthermore, each terminal synchronizes with the nearest two terminals on a ring communication network. For example, if there are A, B, C and D terminals in that sequence on a ring communication network then terminal A synchronizes with terminals B and D, terminal B synchronizes with terminals A and C and so on.

Figure 7:
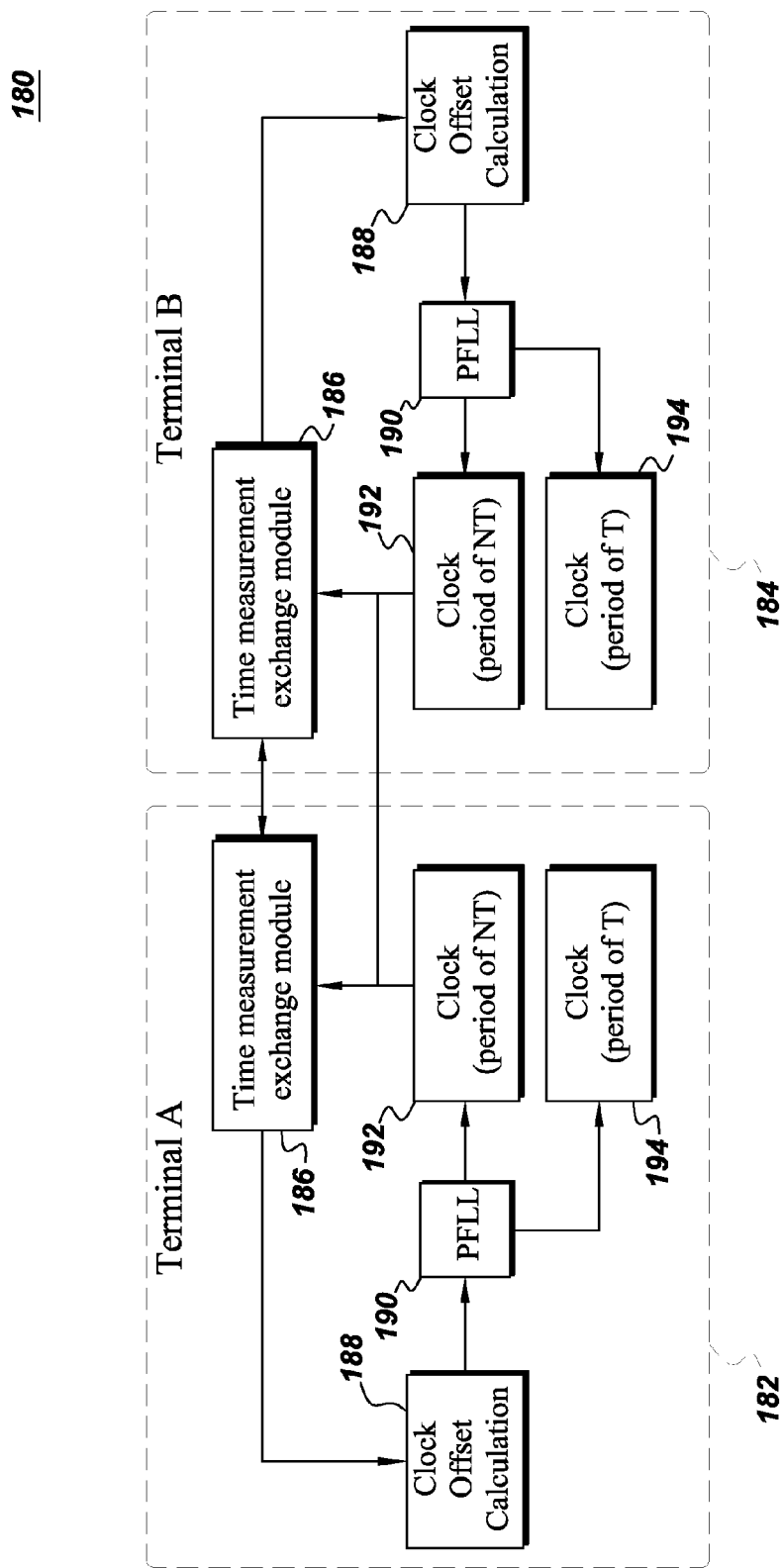
FIG. 7 is a schematic diagram of a clock synchronization system in accordance with an embodiment of the present invention.

FIG. 7 shows a clock synchronization system 180 in accordance with an embodiment of the present invention. Clock synchronization system 180 includes two controllers 182, 184 located at two different terminals. Each of the controllers 182, 184 includes a time measurement exchange module 186, a clock offset calculation module 188, a phase-frequency locked loop (PFLL) 190, and dual clocks 192 and 194 with upper and lower ranges respectively. Controllers 182, 184 also have other components as shown in FIG. 2. However, for simplicity only the components related to the clock synchronization are shown here. Time measurement exchange module 186 receives and transmits time signals (e.g., T1, T2, T3 etc.) from a remote terminal. Even though in FIG. 7 communication between only two terminals is shown, time measurement exchange module 186 may communicate with more than two terminals and exchange time signals. As an example, assume that time measurement exchange module 186 communicates with three terminals. Clock offset calculation module 188 then utilizes the algorithm in FIG. 6 and further determines the overall time delay by averaging the time delay between the three terminals. For a three terminal system (A-B-C), clock offset calculation module 188 will first determine two time delays $T_{AB}$ and $T_{AC}$ utilizing the algorithm in FIG. 6 and then determine an average time delay $T_{A,BC}$ utilizing the relation:

$$T_{A,BC} = (T_{AB} + T_{AC})/2 \tag{9}$$

Thus, clock offset calculation module 188 provides an average time offset or overall time delay as a phase input to PFLL 190. An exemplary PFLL 90 is disclosed in issued U.S. Pat. No. 5,958,060 assigned to General Electric Company and is incorporated herein by reference. PFLL 190 provides a signal to clocks 192, 194 to adjust their frequencies. Clock 194 then provides a first clock signal to tag the phasors and clock 192 provides a second clock signal to time measurement exchange module 186 for clock synchronization purpose.

A first time period which is of Clock 192 is kept to be equal to N times a second time period which is of clock 194, where N is the number of terminals used for clock synchronization. As an example, if there are 4 terminals and clock 194 has a time period equal to 12 counts then clock 192 will have a time period of 48 counts i.e., clock 194 will rollover after 12 counts whereas clock 192 will rollover after 48 counts.

Figure 8:
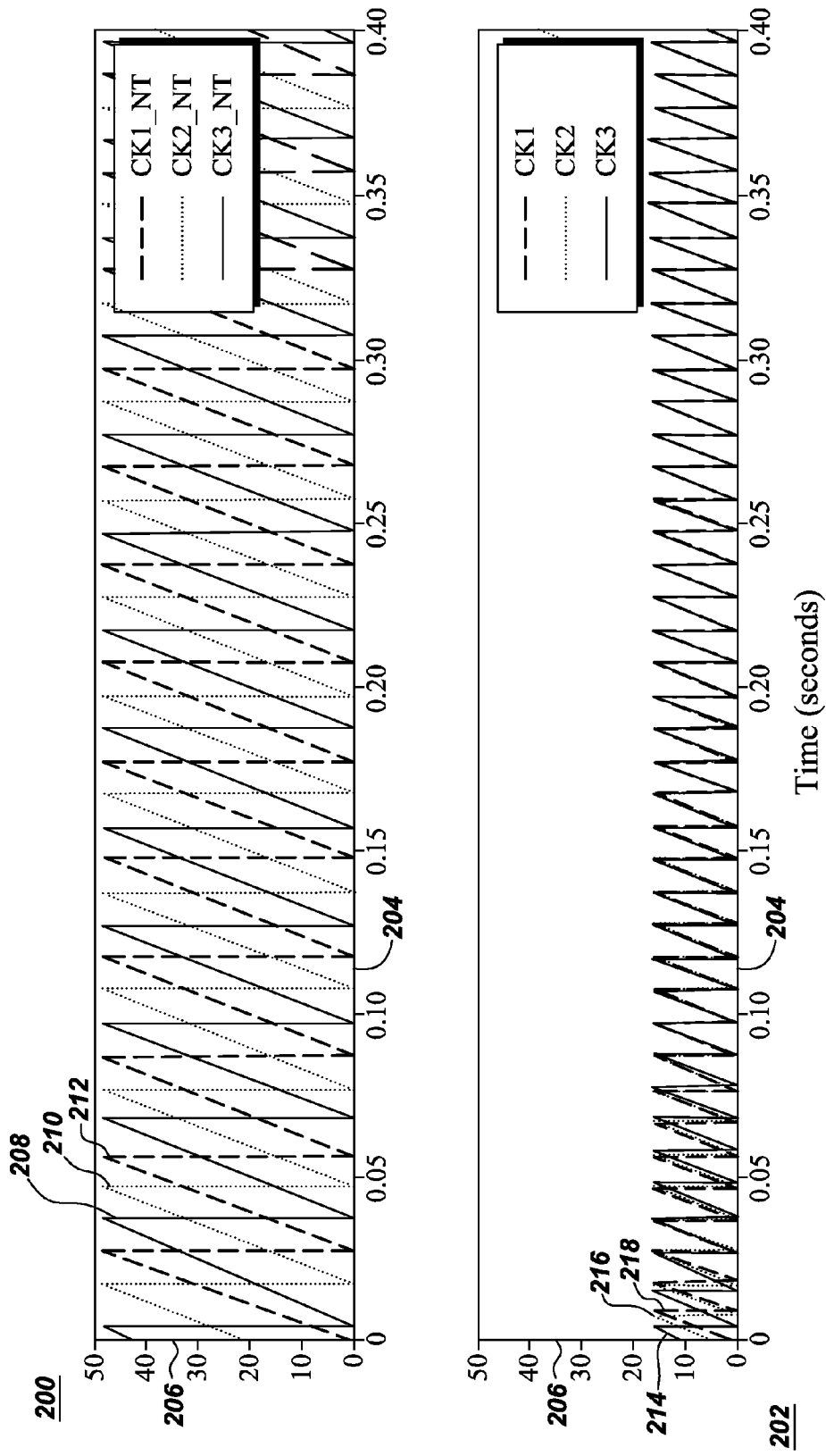
FIG. 8 is a graphical representation of simulation results of clock synchronization for a three terminal system.

FIG. 8 shows two graphical plots 200 and 202 of simulation results of clock synchronization for a three terminal system. A horizontal axis 204 in plots 200 and 202 represents a real time in seconds and a vertical axis 206 represents a clock time in count number. Plot 200 shows three clock waveforms 208, 210 and 212 related to higher range clocks at three terminals utilized for clock synchronization whereas plot 202 shows three clock waveforms 214, 216 and 218 related to lower range clocks at three terminals utilized for phasor tagging. Clock waveforms 214, 216 and 218 have a time period related to T=16 counts whereas clock waveforms 208, 210 and 212 have a time period related to NT=3*16=48 counts. As can be seen even though clock waveforms 208, 210 and 212 are not synchronized with each other, clock waveforms 214, 216 and 218 do get synchronized after a short time, thus, resulting in synchronized phasor tagging.

One of the advantages of the present digital current differential protection system includes synchronization of clocks at multi-terminals without the use of geographical positioning system (GPS). Furthermore, the digital current differential protection system may be applied to any number of terminals.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A current differential protection system for a multi-terminal power line comprising:
    a current sensor for sensing a current at a local terminal;
    a controller for time synchronizing the local terminal and remote terminals, the controller comprising:
        a time measurement exchange module for exchanging time stamp data with remote terminals;
        an upper range clock for providing local time measurements to the time measurement exchange module;
        a lower range clock for indexing the current at the local terminal, wherein a first time period of the upper range clock is N times a second time period of the lower range clock where N is a number of terminals in the multi-terminal system;
        a clock offset calculation module for determining an average time offset based on time stamp data from remote terminals and the local terminal;
        a phase-frequency locked loop for determining phase and frequency signals for the upper range clock and the lower range clock based on the average time offset; and
    a fault detection module to detect a fault in the multi-terminal power line if a differential current exceeds a threshold value.

2. The current differential protection system of claim 1, wherein the clock offset calculation module is configured to determine the average time offset by averaging communication time delays between the local terminal and each of the remote terminals.

3. The current differential protection system of claim 2, wherein the time measurement exchange module is configured to exchange the time stamp data including a message sent and a message received time at the local terminal and a message sent and a message received time at remote terminals.

4. The current differential protection system of claim 3, wherein the clock offset calculation module is configured to determine the communication time delay between the local terminal and each of the remote terminals based on a subtraction of a summation of the message sent and the message received times at the remote terminal and a summation of the message sent and the message received times at the local terminal.

5. The current differential protection system of claim 4, wherein the clock offset calculation module is configured to determine the communication time delay based on rollover instances of the upper range clock.

6. The current differential protection system of claim 5, wherein the clock offset calculation module is configured to adjust the message received time by the first time period of the upper range clock if the upper range clock rolls over between the message sent time and the message received time.

7. The current differential protection system of claim 6, wherein the clock offset calculation module is configured to adjust the communication time delay if the upper range clock rolls over before the message sent time.

8. The current differential protection system of claim 1, wherein the fault detection module is configured to determine the differential current by a vector addition of the current at local terminal and a second current of at least one of the remote terminals.

9. The current differential protection system of claim 1, the fault detection module is configured to determine the threshold value by a sum of a minimum differential current that can flow through the multi-terminal power line and a restraint current permissible beyond the minimum differential current.

10. The current differential protection system of claim 1 further comprising an analog to digital converter which samples the current at the local terminal.

11. The current differential protection system of claim 10, wherein the controller is configured for indexing the current at the local terminal based on a sampling frequency of the analog to digital converter.

12. A method of protecting a multi-terminal power line comprising:
    sensing a current at a local terminal;
    exchanging time stamp data with remote terminals;
    utilizing an upper range clock for providing local time measurements;
    utilizing a lower range clock for indexing the current at the local terminal, wherein a first time period of the upper range clock is N times a second time period of the lower range clock where N is a number of terminals in the multi-terminal system;
    determining an average time offset based on time stamp data from remote terminals and the local terminal;
    determining phase and frequency signals for the upper range clock and the lower range clock based on the average time offset; and
    detecting a fault in the multi-terminal power line if a differential current exceeds a threshold value.

13. The method of protecting a multi-terminal power line of claim 12, wherein determining the average time offset comprises averaging communication time delays between the local terminal and each of the remote terminals.

14. The method of protecting a multi-terminal power line of claim 13, wherein exchanging the time stamp data comprises exchanging a message sent and a message received time at the local terminal and a message sent and a message received time at remote terminals.

15. The method of protecting a multi-terminal power line of claim 14, wherein determining the average time offset comprises determining the communication time delay between the local terminal and each of the remote terminals on a subtraction of a summation of the message sent and the message received times at the remote terminal and a summation of the message sent and the message received times at the local terminal.

16. The method of protecting a multi-terminal power line of claim 15, wherein determining the average time offset comprises determining the communication time delay based on rollover instances of the upper range clock.

17. The method of protecting a multi-terminal power line of claim 16, wherein determining the average time offset comprises adjusting the message received time by the first time period of the upper range clock if the upper range clock rolls over between the message sent time and the message received time.

18. The method of protecting a multi-terminal power line of claim 17, wherein determining the average time offset comprises adjusting the communication time delay by the first time period of the upper range clock if the upper range clock rolls over before the message sent time.

19. The method of protecting a multi-terminal power line of claim 12, wherein detecting the fault in the multi-terminal power line comprises determining the differential current by a vector addition of the current at local terminal and a second current of at least one of the remote terminals.

20. The method of protecting a multi-terminal power line of claim 12, wherein detecting the fault in the multi-terminal power line comprises determining the threshold value by a sum of a minimum differential current that can flow through the multi-terminal power line and a restraint current permissible beyond the minimum differential current.

* * * * *